(12) United States Patent
Chen et al.

(10) Patent No.: US 10,047,791 B2
(45) Date of Patent: Aug. 14, 2018

(54) SLIDE RAIL ASSEMBLY AND RAIL KIT THEREOF

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/458,049

(22) Filed: Mar. 14, 2017

(65) Prior Publication Data

US 2018/0073559 A1   Mar. 15, 2018

(30) Foreign Application Priority Data

Sep. 13, 2016   (TW) .............................. 105129907 A

(51) Int. Cl.
| | |
|---|---|
| *A47B 88/00* | (2017.01) |
| *F16C 29/10* | (2006.01) |
| *F16C 29/02* | (2006.01) |
| *A47B 96/07* | (2006.01) |
| *A47B 88/40* | (2017.01) |
| *A47B 88/44* | (2017.01) |

(52) U.S. Cl.
CPC .............. *F16C 29/10* (2013.01); *A47B 96/07* (2013.01); *F16C 29/02* (2013.01); *A47B 88/40* (2017.01); *A47B 88/44* (2017.01)

(58) Field of Classification Search
CPC ....... A47B 88/40; A47B 88/44; A47B 88/443; A47B 88/45; A47B 2210/0064; A47B 2210/0067
See application file for complete search history.

(56) References Cited

U.S. PATENT DOCUMENTS

| | | | |
|---|---|---|---|
| 6,412,891 B1 * | 7/2002 | Liang ................... | A47B 88/487 312/333 |
| 6,789,862 B2 | 9/2004 | Shih-Long | |
| 7,731,312 B2 * | 6/2010 | Chen ..................... | A47B 88/57 312/333 |

(Continued)

FOREIGN PATENT DOCUMENTS

| | | |
|---|---|---|
| DE | 202 10 858 U1 | 9/2002 |
| DE | 103 34 952 A1 | 3/2005 |

(Continued)

*Primary Examiner* — Daniel J Rohrhoff
(74) *Attorney, Agent, or Firm* — Winston Hsu

(57) ABSTRACT

A slide rail assembly includes a first rail, a second rail, a first locking device and a second locking device. The first rail includes a blocking part. The first locking device is arranged on the second rail and configured to lock the blocking part of the first rail when the second rail is moved to a first predetermined position relative to the first rail. The second locking device is arranged on the second rail and configured to lock the blocking part of the first rail when the second rail is moved to a second predetermined position relative to the first rail.

19 Claims, 12 Drawing Sheets

(56) References Cited

U.S. PATENT DOCUMENTS

| | | |
|---|---|---|
| 8,007,060 B2 | 8/2011 | Duan |
| 8,534,782 B2 | 9/2013 | Yu |
| 8,690,271 B1* | 4/2014 | Chang .................. H05K 7/1489 248/298.1 |
| 9,301,609 B2* | 4/2016 | Muller .................. A47B 88/493 |
| 9,538,845 B1* | 1/2017 | Chen ...................... A47B 88/49 |
| 2005/0074190 A1 | 4/2005 | Traiser |
| 2006/0163983 A1* | 7/2006 | Wu ...................... A47B 88/493 312/333 |
| 2017/0159710 A1* | 6/2017 | Chen ...................... F16C 43/04 |
| 2017/0340110 A1* | 11/2017 | Chen ...................... H05K 7/183 |

FOREIGN PATENT DOCUMENTS

| | | |
|---|---|---|
| JP | 3132884 U | 6/2007 |
| JP | 2017-47165 A | 3/2017 |
| JP | 2017-74351 A | 4/2017 |

\* cited by examiner

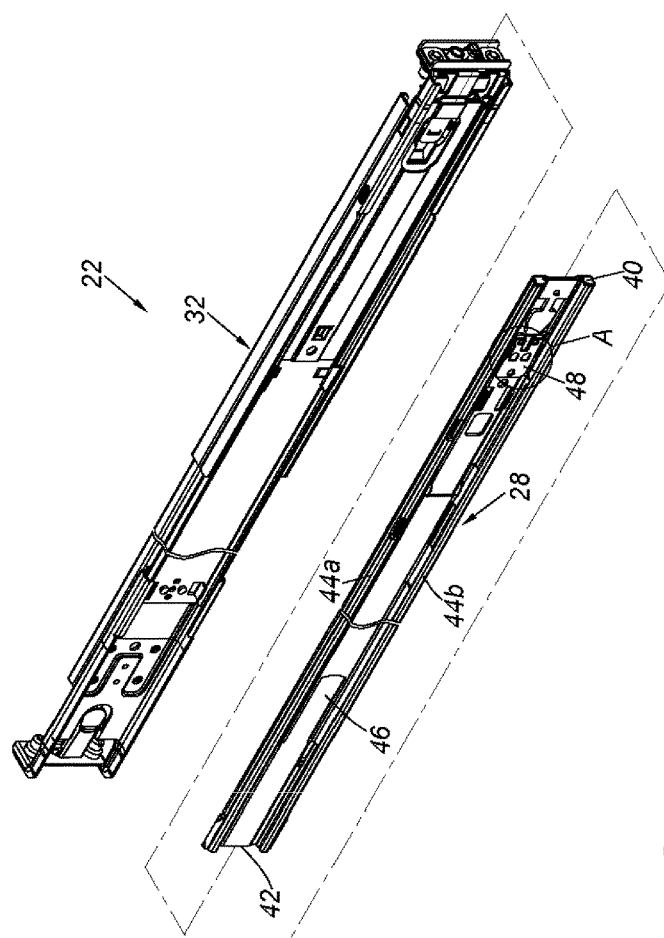
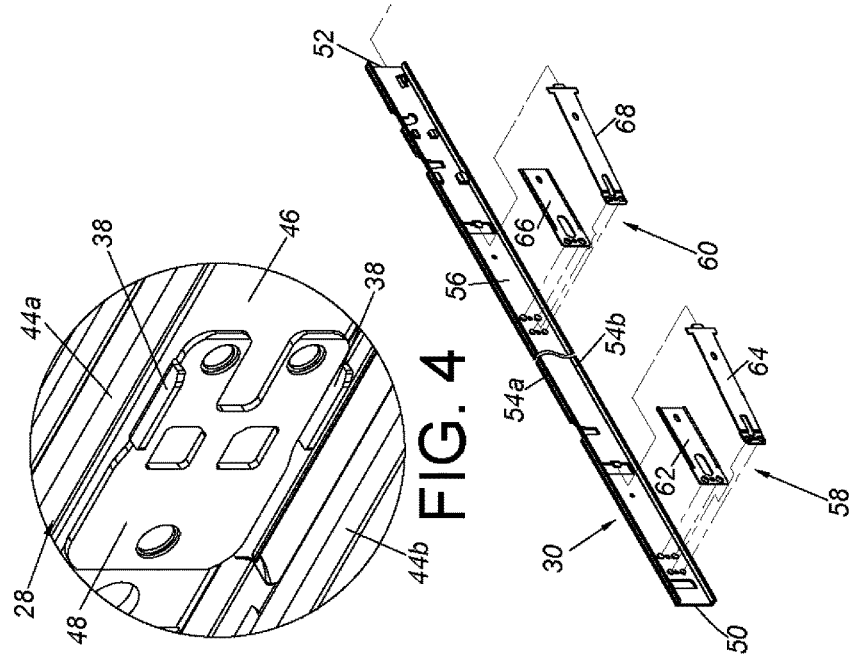
FIG. 3
FIG. 4

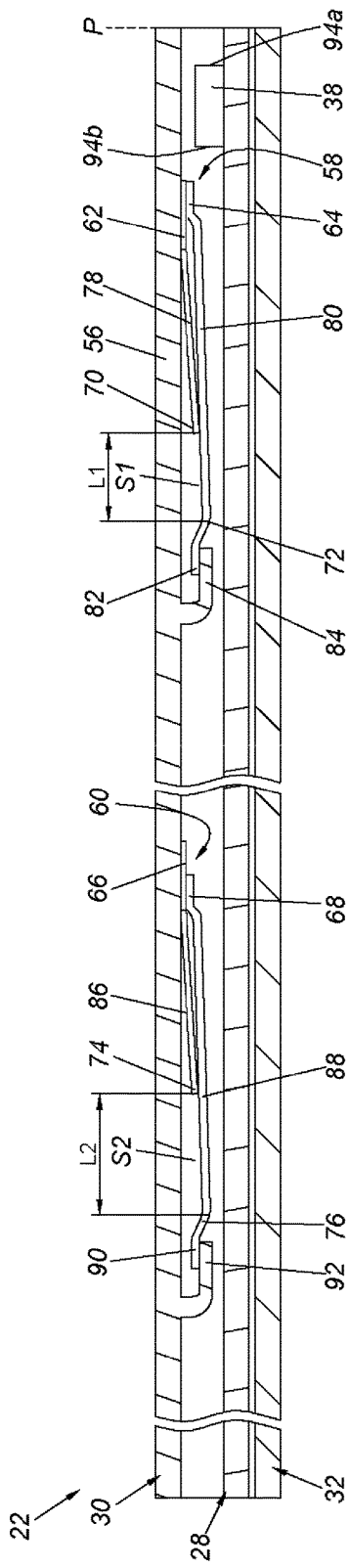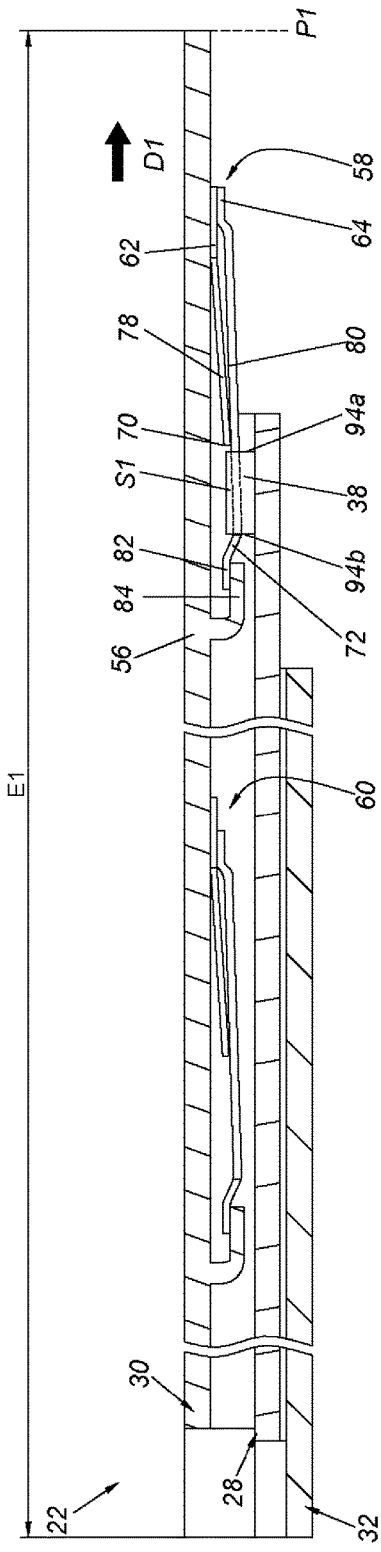

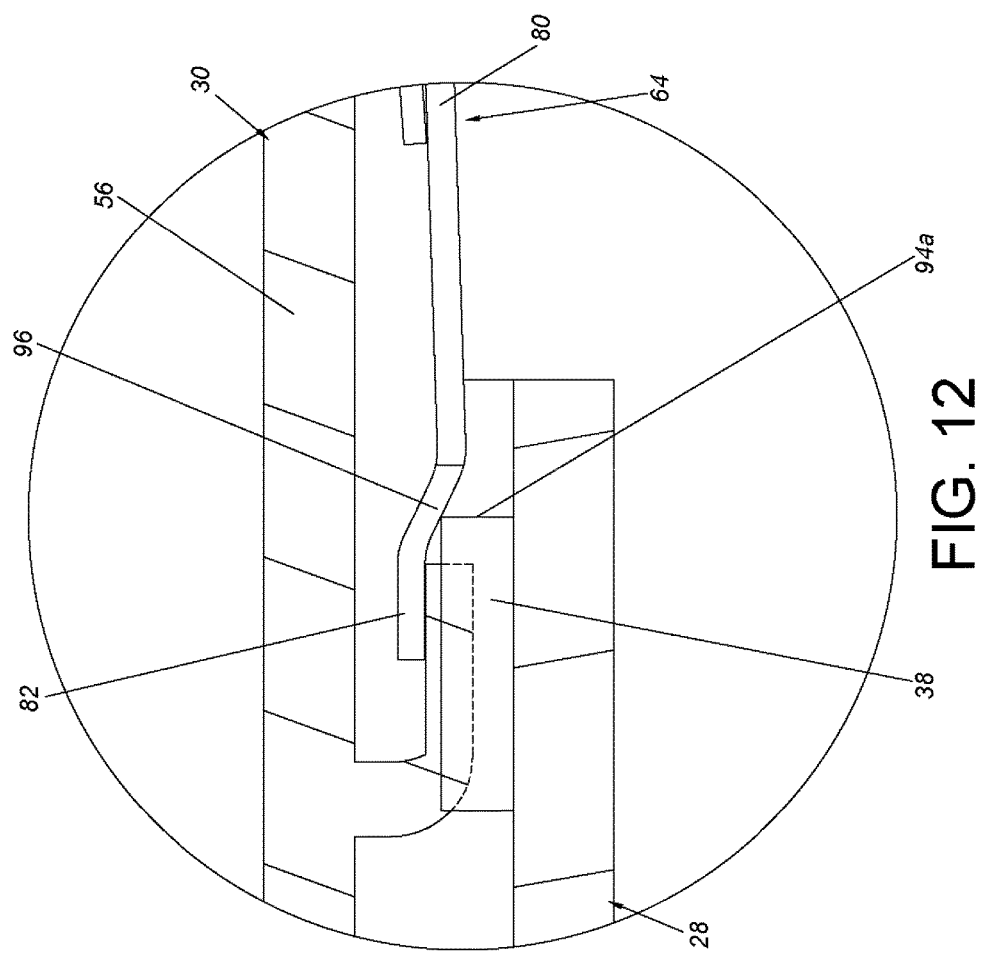

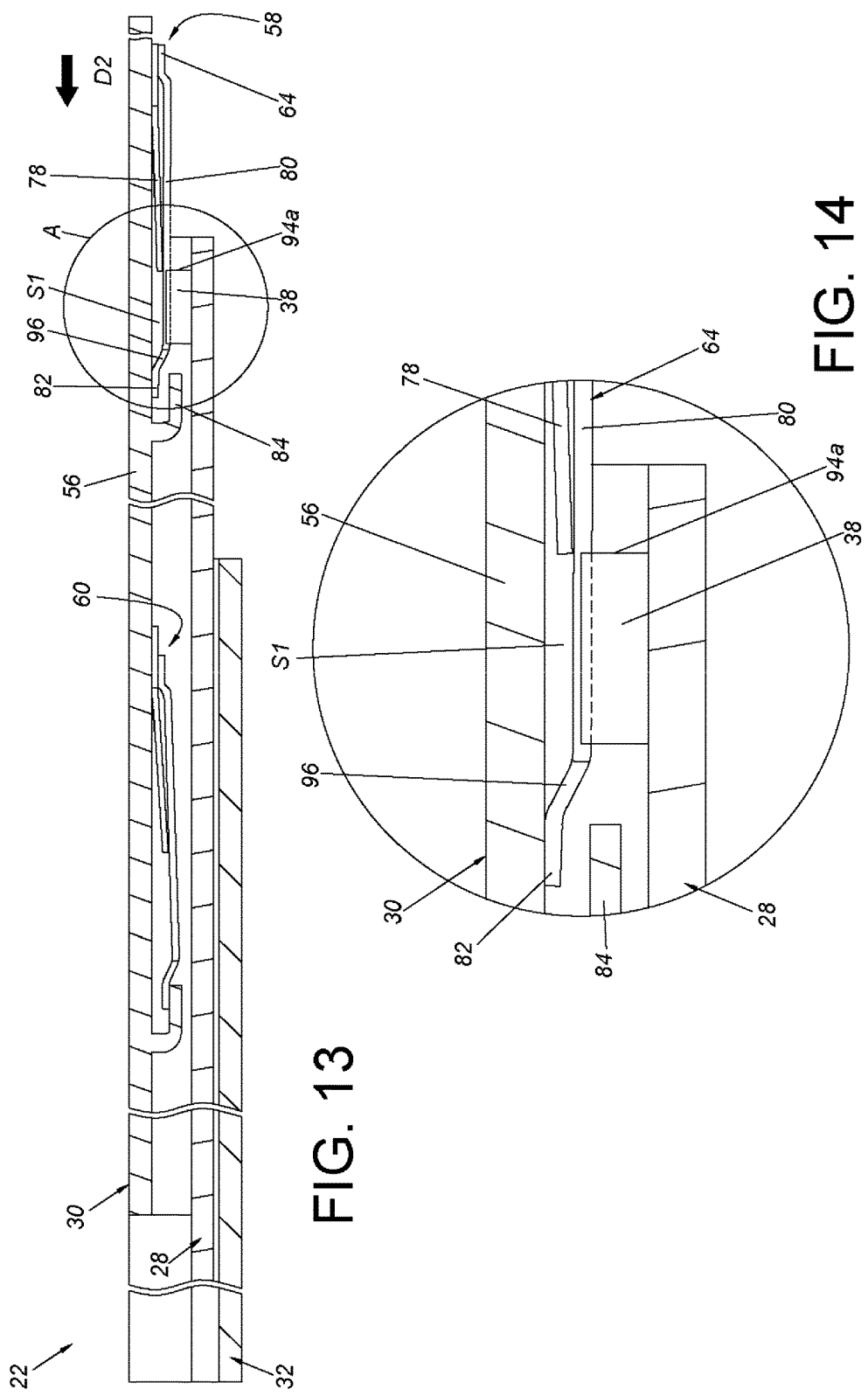

SLIDE RAIL ASSEMBLY AND RAIL KIT THEREOF

BACKGROUND OF THE INVENTION

1. Field of the Invention

The present invention relates to a slide rail assembly, and more particularly, to a slide rail assembly having a locking mechanism.

2. Description of the Prior Art

Generally, a slide rail assembly comprises a first rail and a second rail movable relative to the first rail. Wherein, when the second rail is moved relative to the first rail along a direction to a predetermined position, a blocking structure arranged between the first rail and the second rail can prevent the second rail from being further moved relative to the first rail along the direction, in order to hold the second rail at the predetermined position. As related technology keeps improving, a slide rail assembly is provided to have a second rail configured to be blocked by a blocking mechanism at a predetermined position relative to the first rail, and an operating part configured to be operated to unlock the blocking mechanism in order to allow the second rail to be moved relative to the first rail along a direction. For example, U.S. Pat. No. 6,412,891 B1 discloses a slide assembly comprising an outer member (20), an inner member (30), a stop member (50) and a pivot member (70). Wherein, the pivot member (70) is pivoted to the inner member (30). When the inner member (30) is located at a position relative to the outer member (20), the pivot member (70) and the stop member (50) block each other to prevent the inner member (30) from being moved relative to the outer member (20).

However, for different market requirements, it is important to provide different slide rail assemblies applicable in limited space, in order to facilitate equipment maintenance.

SUMMARY OF THE INVENTION

The present invention relates to a slide rail assembly having a locking mechanism and a rail kit thereof.

According to an embodiment of the present invention, a slide rail assembly comprises a first rail, a second rail, a first locking device and a second locking device. The first rail comprises a blocking part. The second rail is movable relative to the first rail. The first locking device is arranged on the second rail. The first locking device comprises a first member and a second member. The first member comprises a first part. The second member comprises a second part. A first space is defined between the first part and the second part. The second locking device is arranged on the second rail. The second locking device comprises a third member and a fourth member. The third member comprises a third part. The fourth member comprises a fourth part. A second space is defined between the third part and the fourth part. Wherein, when the second rail is moved relative to the first rail from a retracted position to a first predetermined position along a first direction, the first space is configured to accommodate the blocking part of the first rail and to lock the blocking part. Wherein, when the first locking device is operated to unlock the blocking part, and the second rail is moved relative to the first rail from the first predetermined position to a second predetermined position along the first direction, the second space is configured to accommodate the blocking part of the first rail and to lock the blocking part.

Preferably, when the second locking device is operated to unlock the blocking part, the second rail is movable relative to the first rail from the second predetermined position to the retracted position along a second direction.

Preferably, the first member further comprises a first elastic section, the first part is arranged at an end of the first elastic section, the second member further comprises a second elastic section, the second part is arranged at an end of the second elastic section.

Preferably, the first elastic section is located between the second rail and the second elastic section, the first elastic section and the second elastic section are tilted relative to the second rail.

Preferably, the second member further comprises a first extension section connected to the second elastic section, the second rail comprises a first supporting part configured to abut against the first extension section.

Preferably, the third member further comprises a third elastic section, the third part is arranged at an end of the third elastic section, the fourth member further comprises a fourth elastic section, the fourth part is arranged at an end of the fourth elastic section.

Preferably, the first space is smaller than the second space.

Preferably, the slide rail assembly further comprises a third rail, wherein the first rail is movably arranged between the second rail and the third rail.

According to another embodiment of the present invention, a slide rail assembly comprises a first rail, a second rail, a first locking device and a second locking device. The first rail comprises a blocking part. The second rail is configured to move relative to the first rail along a first direction to be in an extended status. The first locking device is connected to the second rail. The first locking device is configured to block two sides of the blocking part of the first rail when the second rail is located at a first predetermined position relative to the first rail. The second locking device is connected to the second rail. The first locking device is configured to block two sides of the blocking part of the first rail when the second rail is located at a second predetermined position relative to the first rail.

According to yet another embodiment of the present invention, a rail kit comprises a slide rail, a first locking device, a second locking device. The first locking device is arranged on the slide rail. The first locking device comprises a first member and a second member. The first member comprises a first elastic section and a first part arranged at an end of the first elastic section. The second member comprises a second elastic section and a second part arranged at an end of the second elastic section. A first space is defined between the first part and the second part. The second locking device is arranged on the slide rail. The second locking device comprises a third member and a fourth member. The third member comprises a third elastic section and a third part arranged at an end of the third elastic section. The fourth member comprises a fourth elastic section and a fourth part arranged at an end of the fourth elastic section. A second space is defined between the third part and the fourth part.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is an exploded view of the slide rail assembly according to an embodiment of the present invention.

FIG. 4 is an enlarged view of an area A of FIG. 3.

FIG. 6 is a cross-sectional view of the slide rail assembly in a retracted status according to an embodiment of the present invention.

FIG. 7 is a cross-sectional view of a second rail of the slide rail assembly being moved relative to a first rail along a first direction to be in a first extended status, and a first locking device locking a blocking part of the first rail according to an embodiment of the present invention.

FIG. 12 is an enlarged view of an area A of FIG. 11.

FIG. 13 is a diagram showing a position of a first space defined by the first locking device corresponding to the blocking part of the first rail according to an embodiment of the present invention.

FIG. 14 is an enlarged view of an area A of FIG. 13.

DETAILED DESCRIPTION

Figure 1:
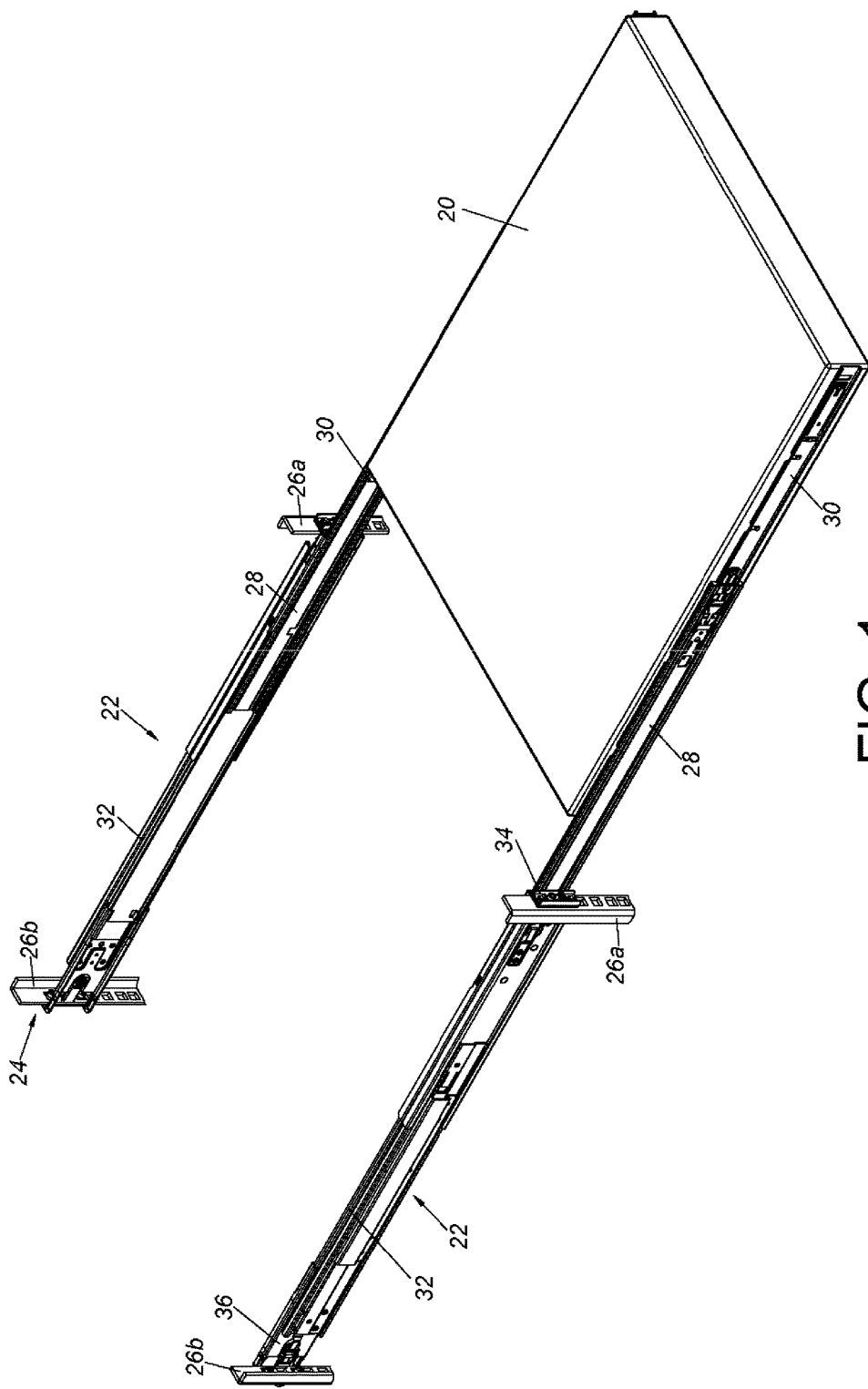
FIG. 1 is a diagram showing slide rail assemblies configured to mount a carried object to a rack according to an embodiment of the present invention.

As shown in FIG. 1, a carried object 20 can be mounted to a rack 24 through a pair of slide rail assemblies 22. The carried object 20 can be an electronic apparatus. The rack 24 comprises a pair of first posts 26a and a pair of second posts 26b. Each of the slide rail assemblies 22 comprises a first rail 28 and a second rail 30. Preferably, each of the slide rail assemblies 22 further comprises a third rail 32. The first rail 28 is arranged between the second rail 30 and the third rail 32. Wherein, the third rail 32 can be mounted to the first post 26a and the second post 26b respectively through a first bracket 34 and a second bracket 36. On the other hand, the second rail 30 is configured to mount the carried object 20 in order to allow the carried object 20 to be moved relative to the third rail 32 and/or the first rail 28 through the second rail 30, such that the carried object 20 can be pulled out from the rack 24 or pushed into the rack 24. Such arrangement is well known to those skilled in the art. For simplification, no further illustration is provided.

Figure 2:
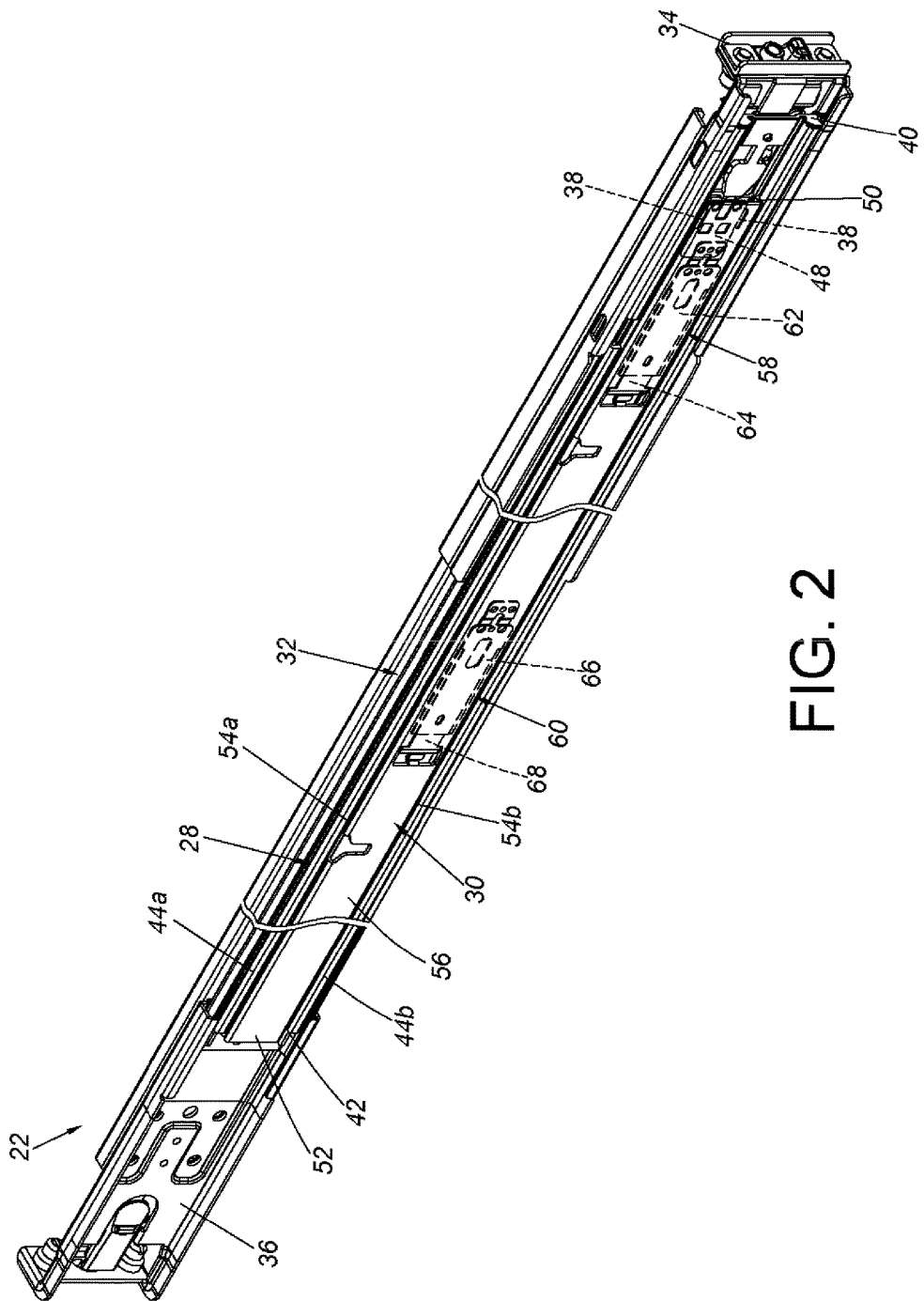
FIG. 2 is a diagram showing the slide rail assembly according to an embodiment of the present invention.

As shown in FIG. 2 and FIG. 3, the first rail 28 of the slide rail assembly 22 is movably mounted between the third rail 32 and the second rail 30.

The first rail 28 comprises at least one blocking part 38 (please refer to FIG. 4). In the present embodiment, the first rail 28 comprises two blocking parts 38. Moreover, the first rail 28 has a front end 40 and a rear end 42, and the first rail 28 further comprises a first wall 44a, a second wall 44b and a side wall 46 connected between the first wall 44a and the second wall 44b. Preferably, the pair of blocking parts 38 is arranged on the side wall 46 and adjacent to the front end 40 of the first rail 28. Wherein, the pair of blocking parts 38 can be protrusions directly formed on the side wall 46 of the first rail 28; or an accessory 48, which comprises the pair of blocking parts 38 protruded relative to the side wall 46 of the first rail 28, can be mounted to the first rail 28 by riveting, welding or screwing. In the present invention, the arrangement of the pair of blocking parts 38 is not limited thereto.

The second rail 30 (also referred to as slide rail) has a front end 50 and a rear end 52, and the second rail 30 comprises a first wall 54a, a second wall 54b and a side wall 56 connected between the first wall 54a and the second wall 54b.

Moreover, the slide rail assembly 22 further comprises a first locking device 58 and a second locking device 60. The first locking device 58 and the second locking device 60 are arranged on the second rail 30 (such as arranged on the side wall 56 of the second rail 30). Specifically, the first locking device 58 and the second locking device 60 are connected to the side wall 56 of the second rail 30. Wherein, the first locking device 58 comprises a first member 62 and a second member 64. On the other hand, the second locking device 60 comprises a third member 66 and a fourth member 68.

Figure 5:
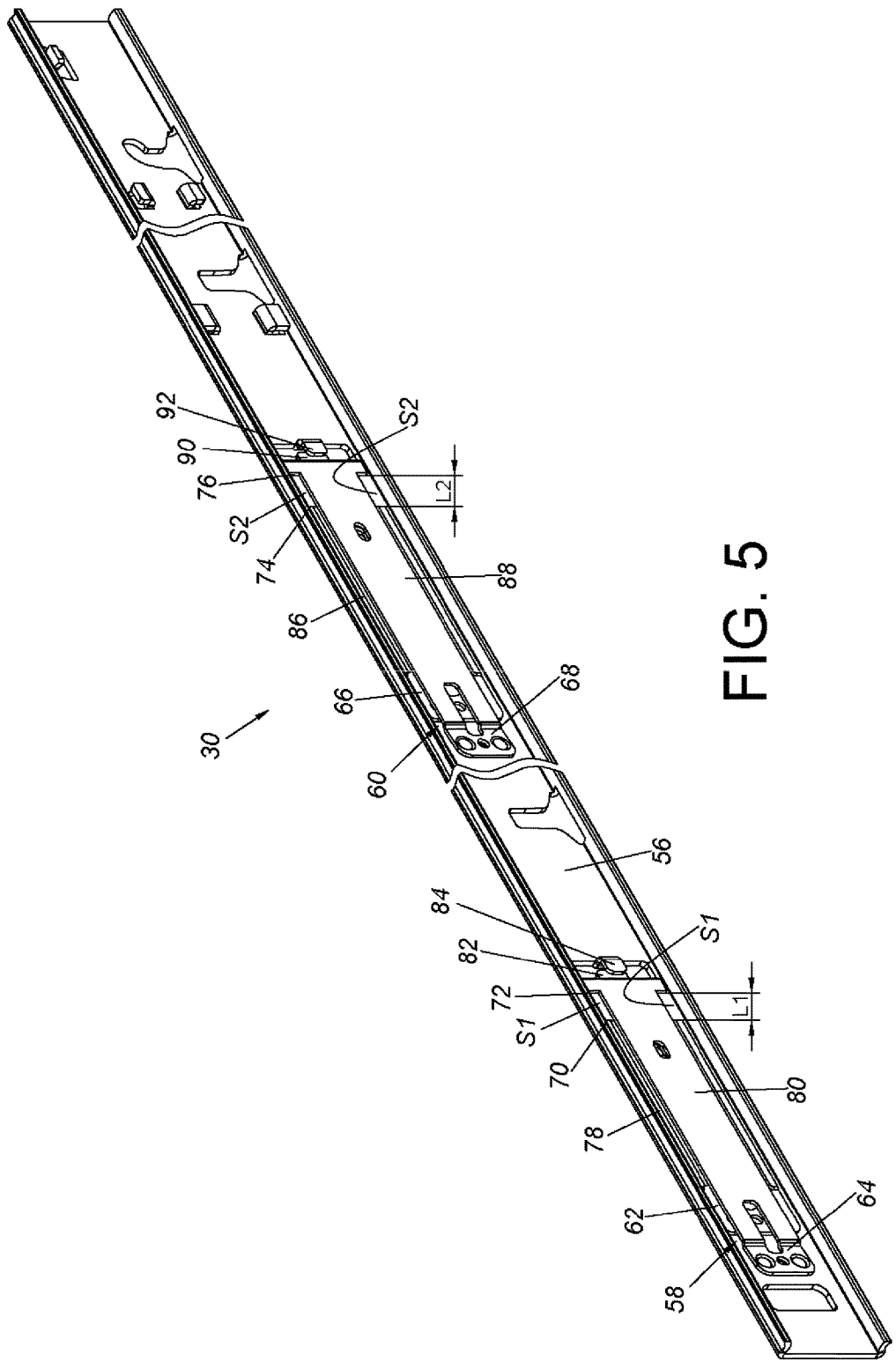
FIG. 5 is a diagram showing a rail kit according to an embodiment of the present invention.

As shown in FIG. 3 and FIG. 5, the second rail 30, the first locking device 58 and the second locking device 60 constitute a rail kit. Specifically, the first member 62 of the first locking device 58 comprises a first part 70, and the second member 64 comprises a second part 72. A first space S1 is defined between the first part 70 and the second part 72. In the present embodiment, two first spaces S1 are provided between the first part 70 and the second part 72. On the other hand, the third member 66 of the second locking device 60 comprises a third part 74, and the fourth member 68 comprises a fourth part 76. A second space S2 is defined between the third part 74 and the fourth part 76. In the present embodiment, two second spaces S2 are provided between the third part 74 and the fourth part 76.

As shown in FIG. 5 and FIG. 6, the first locking device 58 and the second locking device 60 are arranged at different positions on the second rail 30 along a longitudinal direction of the second rail. A longitudinal dimension L1 of the first space S1 is smaller than a longitudinal dimension L2 of the second space S2.

The first member 62 further comprises a first elastic section 78. The first part 70 is arranged at an end of the first elastic section 78. On the other hand, the second member 64 further comprises a second elastic section 80. The second part 72 is arranged at an end of the second elastic section 80. Preferably, the first elastic section 78 is located between the side wall 56 of the second rail 30 and the second elastic section 80. The first elastic section 78 and the second elastic section 80 are tilted relative to the side wall 56 of the second rail 30. Preferably, the second member 64 further comprises a first extension section 82 connected to the second elastic section 80. On the other hand, the side wall 56 of the second rail 30 is arranged with a first supporting part 84 configured to abut against the first extension section 82.

The third member 66 further comprises a third elastic section 86. The third part 74 is arranged at an end of on the third elastic section. On the other hand, the fourth member 68 further comprises a fourth elastic section 88. The fourth part 76 is arranged at an end of on the fourth elastic section 88. Preferably, the third elastic section 86 is located between the side wall 56 of the second rail 30 and the fourth elastic section 88. The third elastic section 86 and the fourth elastic section 88 are tilted relative to the side wall 56 of the second rail 30. Preferably, the fourth member 68 further comprises a second extension section 90 connected to the fourth elastic section 80. On the other hand, the side wall 56 of the second rail 30 is arranged with a second supporting part 84 configured to abut against the second extension section 90.

As shown in FIG. 6, the second rail 30 is in a retracted status relative to the first rail 28 and/or the third rail 32. Specifically, the second rail 30 is located at a retracted position P relative to the first rail 28 and/or the third rail 32.

As shown in FIG. 7, when the second rail 30 is moved from the retracted position P to a first predetermined position P1 along a first direction D1 relative to the first rail 28 and/or the third rail 32, the first locking device 58 is configured to lock the blocking part 38 of the first rail 28, in order to prevent the second rail 30 from moving relative to the first rail 28 along the first direction D1 or a second direction (opposite to the first direction D1). Specifically, when the second rail 30 is located at the first predetermined position P1 relative to the first rail 28, the first space S1 is configured to accommodate the blocking part 38 of the first rail 28. In other words, the first part 70 of the first member 62 and the second part 72 of the second member 64 are located respectively at two sides of the blocking part 38 of the first rail 28 in response to the elastic force of the first elastic section 78 and the second elastic section 80 (for example, the first part 70 is located at a first side 94a of the blocking part 38 of the first rail 28; and the second part 72 is located at a second side 94b of the blocking part 38 of the first rail 28), such that the first locking device 58 is configured to block two sides of the blocking part 38 in order to lock the blocking part 38. In such state, the slide rail assembly 22 has a first extension length E1, and the second rail 30 is in a first extended status relative to the first rail 28.

Figure 8:
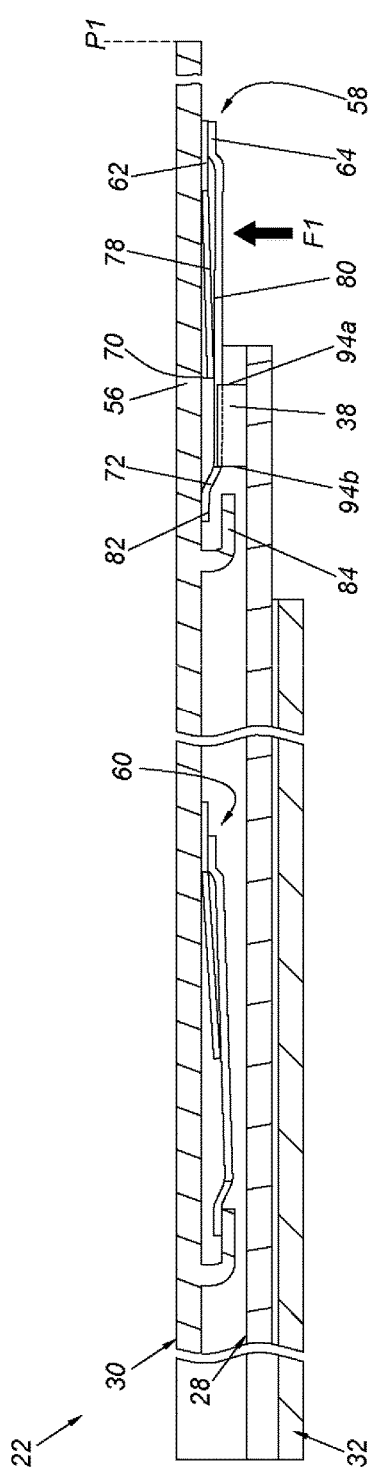
FIG. 8 is a diagram showing the first locking device of the slide rail assembly being operated to unlock the blocking part of the first rail according to an embodiment of the present invention.

As shown in FIG. 7 and FIG. 8, a user can apply a first force F1 to operate the first locking device 58, in order to press the first elastic section 78 of the first member 62 and the second elastic section 80 of the second member 64 to move toward the side wall 56 of the second rail 30, such that the first part 70 of the first member 62 and the second part 72 of the second member 64 no longer block the two sides 94a, 94b of the blocking part 38. In other words, the first locking device 58 is operated to unlock the blocking part 38.

Figure 9:
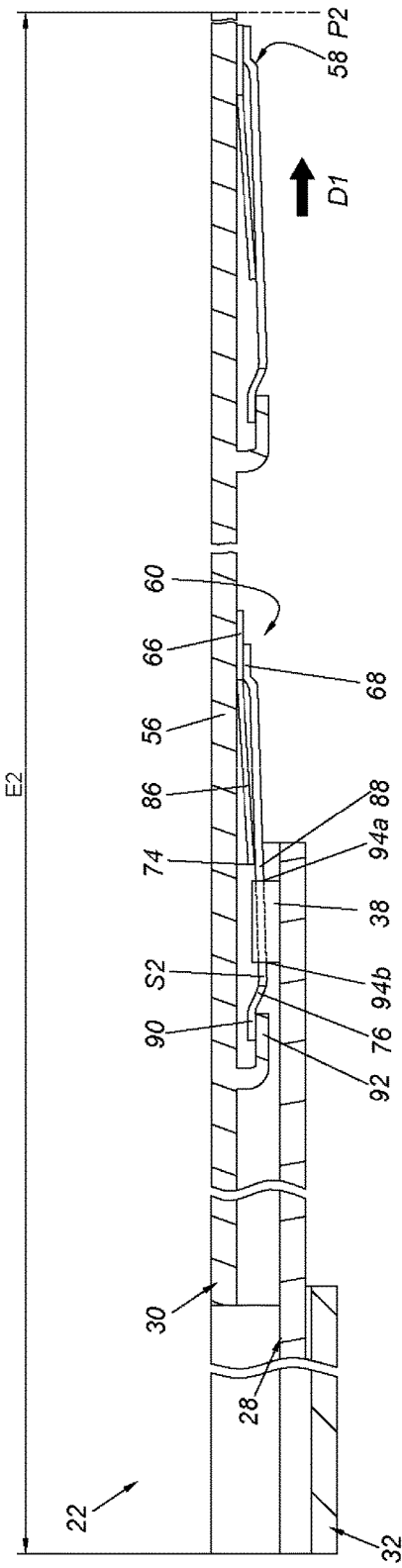
FIG. 9 is a diagram showing the second rail of the slide rail assembly being further moved relative to the first rail along the first direction to be in a second extended status, and a second locking device locking the blocking part of the first rail according to an embodiment of the present invention.

As shown in FIG. 9, in such unlock status, the second rail 30 can be further moved relative to the first rail 28 and/or the third rail 32 from the first predetermined position P1 along the first direction D1. When the second rail is moved to a second predetermined position P2, the second locking device 60 is configured to lock the blocking part 38 of the first rail 28, in order to prevent the second rail 30 from moving relative to the first rail 28 along the first direction D1 or a second direction (opposite to the first direction D1). Specifically, when the second rail 30 is located at the second predetermined position P2 relative to the first rail 28, the second space S2 is configured to accommodate the blocking part 38 of the first rail 28. In other words, the third part 74 of the third member 66 and the fourth part 76 of the fourth member 68 are located respectively at two sides of the blocking part 38 of the first rail 28 in response to the elastic force of the third elastic section 86 and the fourth elastic section 88 (for example, the third part 74 is located at the first side 94a of the blocking part 38 of the first rail 28; and the fourth part 74 is located at the second side 94b of the blocking part 38 of the first rail 28), such that the second locking device 60 is configured to block two sides of the blocking part 38 in order to lock the blocking part 38. In such state, the slide rail assembly 22 has a second extension length E2, and the second rail 30 is in a second extended status (such as in a fully extended status) relative to the first rail 28.

Figure 10:
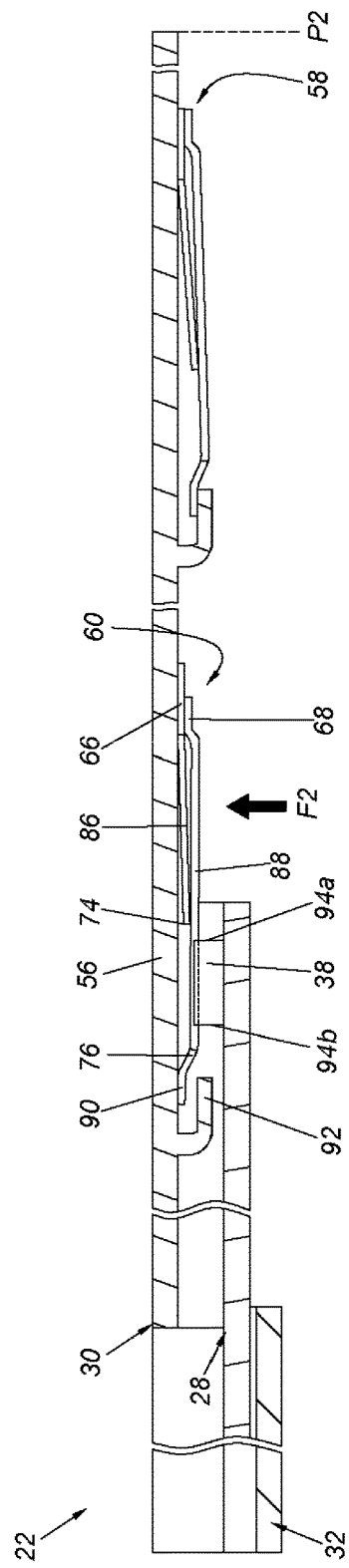
FIG. 10 is a diagram showing the second locking device of the slide rail assembly being operated to unlock the blocking part of the first rail according to an embodiment of the present invention.

As shown in FIG. 9 and FIG. 10, the user can apply a second force F2 to operate the second locking device 60, in order to press the third elastic section 86 of the third member 66 and the fourth elastic section 88 of the fourth member 68 to move toward the side wall 56 of the second rail 30, such that the third part 74 of the third member 66 and the fourth part 76 of the fourth member 68 no longer block the two sides 94a, 94b of the blocking part 38. In other words, the second locking device 60 is operated to unlock the blocking part 38.

Figure 11:
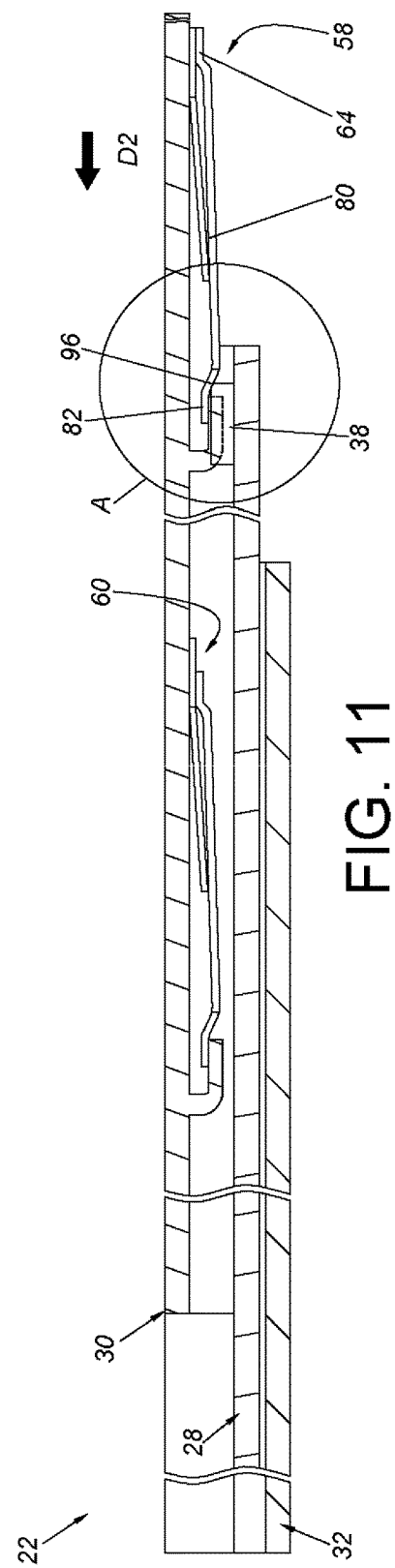
FIG. 11 is a diagram showing the second rail of the slide rail assembly being moved relative to the first rail along a second direction according to an embodiment of the present invention.

As shown in FIG. 11, preferably, a guiding feature 96, such as an inclined or curved face, is arranged between the first extension section 82 and the second elastic section 80 of the second member 64 of the first locking device 58. When the second locking device 60 is operated to unlock the blocking part 38, the second rail 30 is able to be moved relative to the first rail 28 and/or the third rail 32 from the second predetermined position P2 toward the retracted position P along the second direction D2. Moreover, during a process of the second rail 30 being moved along the second direction D2, the guiding feature 96 of the first locking device 58 contacts the first side 94a of the blocking part 38 of the first rail 28 (please also refer to FIG. 12).

Figure 15:
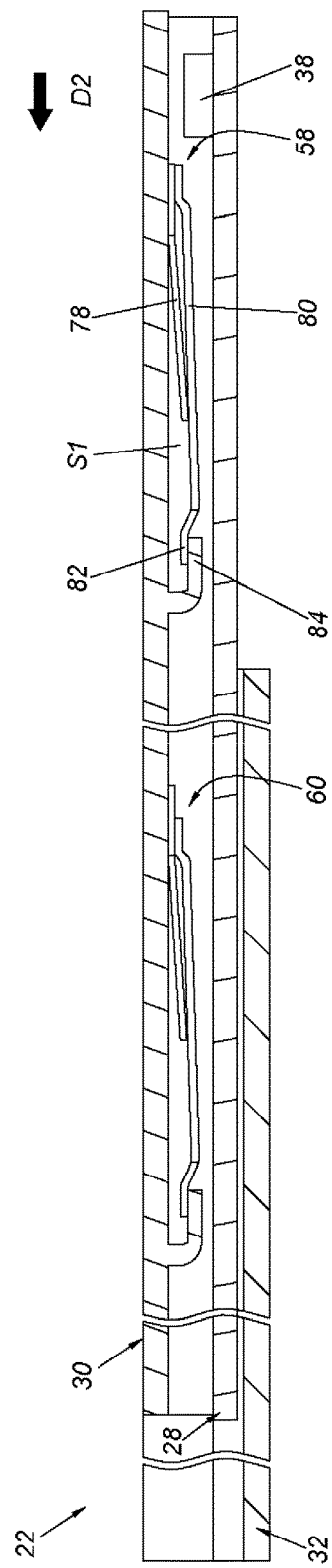
FIG. 15 is a diagram showing the first locking device being moved to cross the blocking part of the first rail according to an embodiment of the present invention.

As shown in FIG. 13, when the second rail 30 is further moved along the second direction D2, the second elastic section 80 and the first elastic section 78 are moved toward the side wall 56 of the second rail 30 to accumulate an elastic force (please also refer to FIG. 14) in response to sliding contact between the guiding feature 96 and the first side 94a of the blocking part 38 of the first rail 28, and the first extension section 82 does not abut against the first supporting part 84 of the second rail 30. Furthermore, when a movement of the second rail 30 along the second direction D2 is faster than a recovery movement of the first elastic section 78 driven by the elastic force, the first space S1 can directly cross the blocking part 38 of the first rail 28 (please also refer to FIG. 15, wherein the second elastic section 80 and the first elastic section 78 release the elastic force, in order to allow the first extension section 82 to abut against the first supporting part 84 of the second rail 30 again). In other words, the first locking device 58 is prevented from locking the blocking part 38 of the first rail 28, such that the second rail 30 can be directly moved to the retracted position P (please also refer to FIG. 6) relative to the first rail 28 and/or the third rail 32 to be in the retracted status again.

Figure 16:
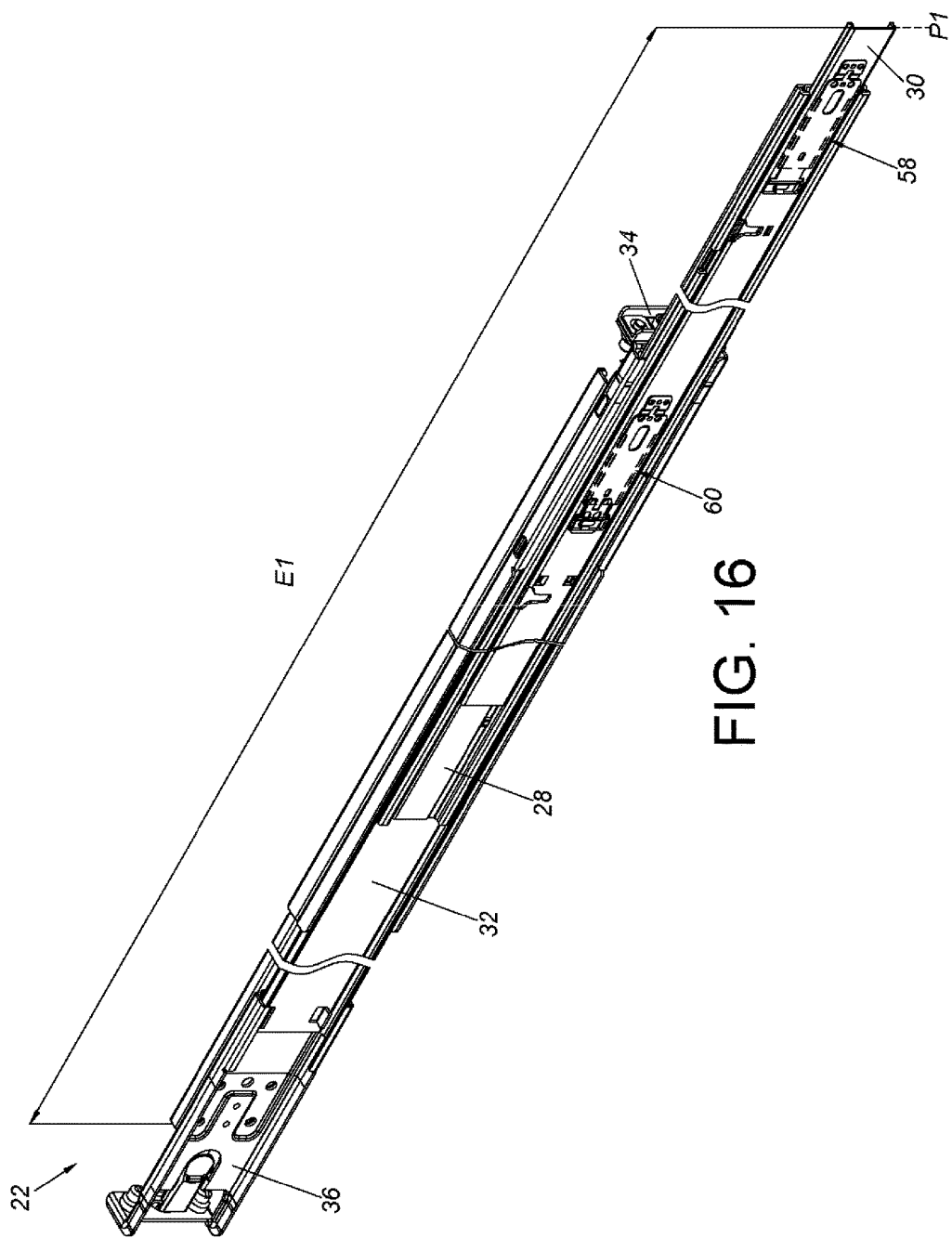
FIG. 16 is a diagram showing the slide rail assembly being extended to have a first extension length according to an embodiment of the present invention.

As shown in FIG. 16, when the second rail 30 is located at the first predetermined position P1 relative to the first rail 28 and/or the third rail 32, and the blocking part 38 is locked by the first locking device 58 (please also refer to FIG. 7), the slide rail assembly 22 has the first extension length E1.

Figure 17:
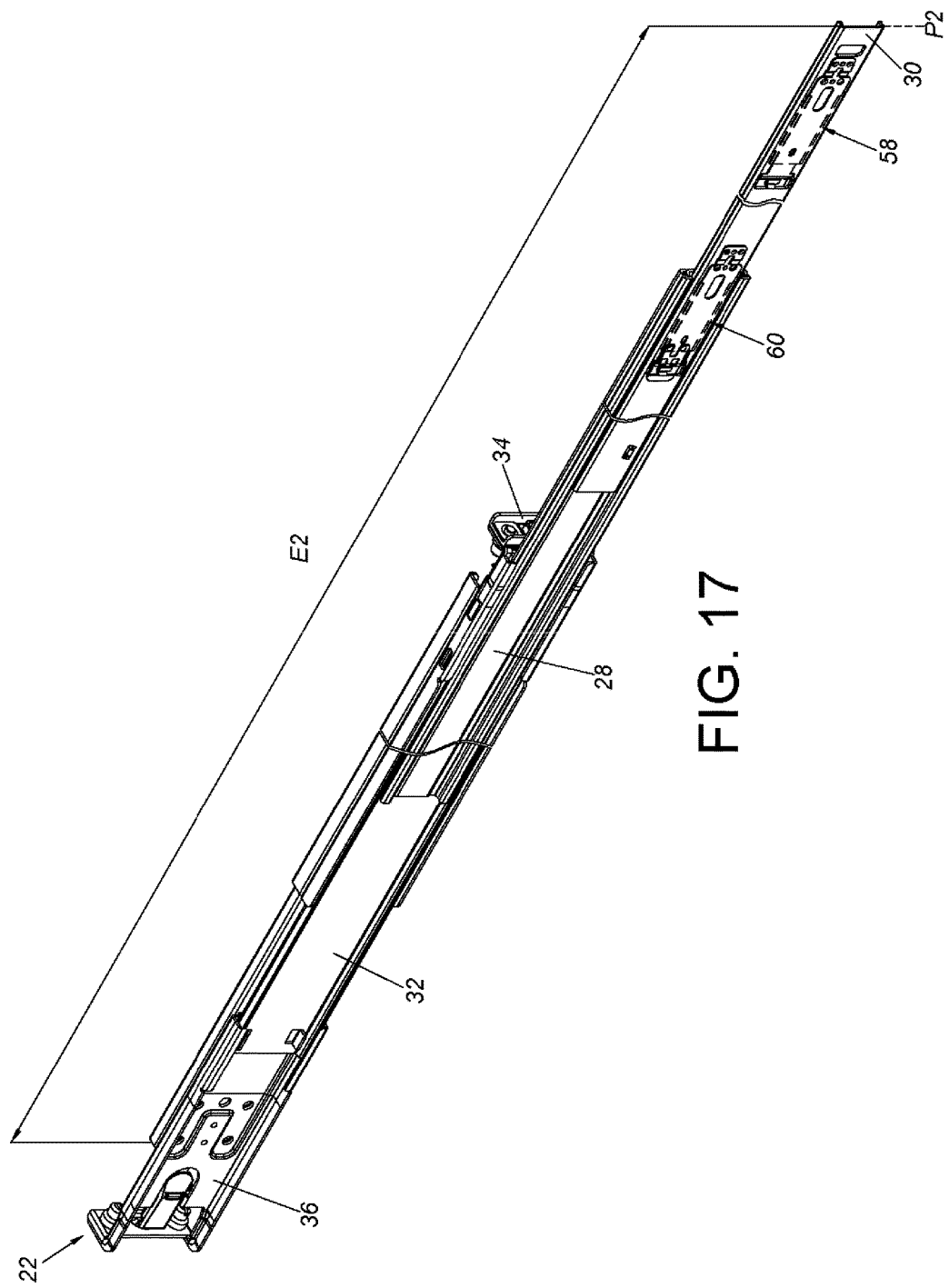
FIG. 17 is a diagram showing the slide rail assembly being extended to have a second extension length according to an embodiment of the present invention.

As shown in FIG. 17, when the second rail 30 is located at the second predetermined position P2 relative to the first rail 28 and/or the third rail 32, and the blocking part 38 is locked by the second locking device 60 (please also refer to FIG. 9), the slide rail assembly 22 has the second extension length E2. Wherein, the second extension length E2 is longer than the first extension length E1.

According to the above arrangement, the slide rail assembly 22 can be locked to have different extension lengths through the first locking device 58 and the second locking device 60. Therefore, the slide rail assembly 22 is applicable to different installation environments for meeting specific requirements of equipment maintenance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail comprising a blocking part;
   a second rail movable relative to the first rail;
   a first locking device arranged on the second rail, the first locking device comprising a first member and a second member, the first member comprising a first part, the second member comprising a second part, a first space being defined between the first part and the second part; and
   a second locking device arranged on the second rail, the second locking device comprising a third member and a fourth member, the third member comprising a third part, the fourth member comprising a fourth part, a second space being defined between the third part and the fourth part;
   wherein when the second rail is moved relative to the first rail from a retracted position to a first predetermined position along a first direction, the first space is configured to accommodate the blocking part of the first rail, such that the blocking part is locked by the first locking device;
   wherein when the first locking device is operated to unlock the blocking part, and the second rail is moved relative to the first rail from the first predetermined position to a second predetermined position along the first direction, the second space is configured to accommodate the blocking part of the first rail, such that the blocking part is locked by the second locking device.

2. The slide rail assembly of claim 1, wherein when the second locking device is operated to unlock the blocking part, the second rail is movable relative to the first rail from the second predetermined position to the retracted position along a second direction.

3. The slide rail assembly of claim 1, wherein the first member further comprises a first elastic section, the first part is arranged at an end of the first elastic section, the second member further comprises a second elastic section, the second part is arranged at an end of the second elastic section.

4. The slide rail assembly of claim 3, wherein the first elastic section is located between the second rail and the second elastic section, the first elastic section and the second elastic section are tilted relative to the second rail.

5. The slide rail assembly of claim 4, wherein the second member further comprises a first extension section connected to the second elastic section, the second rail comprises a first supporting part configured to abut against the first extension section.

6. The slide rail assembly of claim 1, wherein the third member further comprises a third elastic section, the third part is arranged at an end of the third elastic section, the fourth member further comprises a fourth elastic section, the fourth part is arranged at an end of the fourth elastic section.

7. The slide rail assembly of claim 6, wherein the third elastic section is located between the second rail and the fourth elastic section, the third elastic section and the fourth elastic section are tilted relative to the second rail.

8. The slide rail assembly of claim 7, wherein the fourth member further comprises a second extension section connected to the fourth elastic section, the second rail comprises a second supporting part configured to abut against the second extension section.

9. The slide rail assembly of claim 1, wherein the first rail has a front end and a rear end, the blocking part is arranged adjacent to the front end.

10. The slide rail assembly of claim 1, wherein the first locking device and the second locking device are arranged at different positions on the second rail along a longitudinal direction of the second rail.

11. The slide rail assembly of claim 10, wherein the second rail comprises a first wall, a second wall and a side wall connected between the first wall and the second wall, the first locking device and the second locking device are arranged on the side wall of the second rail.

12. The slide rail assembly of claim 1, wherein the first space is smaller than the second space.

13. The slide rail assembly of claim 1, further comprising a third rail, wherein the first rail is movably arranged between the second rail and the third rail.

14. A slide rail assembly, comprising:
    a first rail comprising a blocking part;
    a second rail configured to move relative to the first rail along a first direction to be in an extended status;
    a first locking device connected to the second rail, the first locking device configured to block two sides of the blocking part of the first rail when the second rail is located at a first predetermined position relative to the first rail, the first locking device comprising a first member and a second member, the first member comprising a first part, the second member comprising a second part, a first space being defined between the first part and the second part, the first space being configured to accommodate the blocking part of the first rail when the second rail is located at the first predetermined position; and
    a second locking device connected to the second rail, the second locking device configured to blocking two sides of the blocking part of the first rail when the second rail is located at a second predetermined position relative to the first rail.

15. The slide rail assembly of claim 14, wherein the second locking device comprises a third member and a fourth member, the third member comprises a third part, the fourth member comprises a fourth part, a second space is defined between the third part and the fourth part, the second space is configured to accommodate the blocking part of the first rail when the second rail is located at the second predetermined position.

16. A rail kit, comprising:
    a slide rail;
    a first locking device arranged on the slide rail, the first locking device comprising a first member and a second member, the first member comprising a first elastic section and a first part arranged at an end of the first elastic section, the second member comprising a second elastic section and a second part arranged at an end of the second elastic section, a first space being defined between the first part and the second part; and a second locking device arranged on the slide rail, the second locking device comprising a third member and a fourth member, the third member comprising a third elastic section and a third part arranged at an end of the third elastic section, the fourth member comprising a fourth elastic section and a fourth part arranged at an end of the fourth elastic section, a second space being defined between the third part and the fourth part.

17. The rail kit of claim 16, wherein the first elastic section is located between the slide rail and the second elastic section, the first elastic section and the second elastic section are tilted relative to the slide rail, the second member further comprises a first extension section connected to the second elastic section, the slide rail further comprises a first supporting part configured to abut against the first extension section.

18. The rail kit of claim 16, wherein the third elastic section is located between the slide rail and the fourth elastic section, the third elastic section and the fourth elastic section are tilted relative to the slide rail, the fourth member further comprises a second extension section connected to the fourth elastic section, the slide rail further comprises a second supporting part configured to abut against the first extension section.

19. The rail kit of claim 16, wherein the slide rail comprises a first wall, a second wall and a side wall connected between the first wall and the second wall, the first locking device and the second locking device are arranged on the side wall of the slide rail, the first locking device and the second locking device are arranged at different positions on the second rail along a longitudinal direction of the second rail.

* * * * *